US007821346B2

(12) United States Patent
McCracken

(10) Patent No.: US 7,821,346 B2
(45) Date of Patent: Oct. 26, 2010

(54) OVENIZED OSCILLATOR

(75) Inventor: Jeffrey A. McCracken, Sugar Grove, IL (US)

(73) Assignee: CTS Corporation, Elkhart, IN (US)

( * ) Notice: Subject to any disclaimer, the term of this patent is extended or adjusted under 35 U.S.C. 154(b) by 98 days.

(21) Appl. No.: 12/229,114

(22) Filed: Aug. 20, 2008

(65) Prior Publication Data

US 2009/0051446 A1 Feb. 26, 2009

Related U.S. Application Data

(60) Provisional application No. 60/966,083, filed on Aug. 24, 2007.

(51) Int. Cl.
*H03B 1/00* (2006.01)
*H03B 5/32* (2006.01)
*H03L 1/02* (2006.01)
(52) U.S. Cl. ............... 331/69; 331/108 C; 331/158; 310/315; 310/348
(58) Field of Classification Search ............... 331/66, 331/68, 69, 108 C, 108 D, 116 FE, 116 R, 331/154, 158, 176; 310/311, 315, 346, 348, 310/349, 351, 361, 365, 366
See application file for complete search history.

(56) References Cited

U.S. PATENT DOCUMENTS 5,887,435 A 3/1999 Morton
6,133,674 A 10/2000 Fry
6,501,340 B1 * 12/2002 Flood ..................... 331/69
6,630,869 B2 * 10/2003 Flynn et al. ............. 331/66
7,345,552 B2 * 3/2008 Ito et al. .................. 331/69
7,603,205 B2 * 10/2009 Barry et al. ............. 700/299
7,649,423 B2 * 1/2010 Kasahara ................ 331/69
2005/0040905 A1 * 2/2005 Hatanaka et al. ........ 331/176
2006/0214743 A1 * 9/2006 Arai et al. ............... 331/176
2008/0018409 A1 * 1/2008 Okubo .................... 331/69

FOREIGN PATENT DOCUMENTS

EP 0 994 563 4/2000
WO WO 03/002961 1/2003

OTHER PUBLICATIONS

Waters, Duncan, PCT International Search Report mailed Feb. 16, 2009 re: International Application No. PCT/US2008/010017 filed Aug. 22, 2008.
Waters, Duncan, PCT Written Opinion of the International Searching Authority mailed Feb. 16, 2009 re: International Application No. PCT/US2008/010017 filed Aug. 22, 2008.

* cited by examiner

*Primary Examiner*—Robert Pascal
*Assistant Examiner*—Levi Gannon
(74) *Attorney, Agent, or Firm*—Daniel J. Deneufbourg

(57) ABSTRACT

An ovenized oscillator package including at least a heater and a crystal package mounted on opposite sides of a circuit board. Vias extend through the body of the circuit board to transfer heat from the heater to the crystal package. Layers of thermally conductive material extend through the body of the circuit board and are in thermally coupled relationship with the vias for spreading heat throughout the circuit board and other elements mounted thereon.

6 Claims, 7 Drawing Sheets

US 7,821,346 B2

OVENIZED OSCILLATOR

CROSS-REFERENCE TO RELATED APPLICATION

This application claims the benefit of the filing date of U.S. Provisional Patent Application Ser. No. 60/966,083 filed on Aug. 24, 2007, which is explicitly incorporated herein by reference as are all references cited therein.

FIELD OF THE INVENTION

This invention relates generally to oscillators that can provide a stable reference frequency signal in electronic equipment and, more specifically, to an oscillator that is contained within a heated enclosure to increase the stability of the reference frequency signal.

DESCRIPTION OF THE RELATED ART

Various devices are known for providing a reference frequency or source. Such devices are called oscillators. The oscillator typically includes at least a quartz crystal or other resonator and electronic compensation circuitry adapted to stabilize the output frequency.

Ovenized oscillators (OCXO) heat the temperature sensitive portions of the oscillator, which are isolated from the ambient temperature, to a uniform temperature to obtain a more stable output. Ovenized oscillators contain a heater, a temperature sensor, and circuitry to control the heater. The temperature control circuitry holds the crystal and critical circuitry at a precise, constant temperature. The best controllers are proportional, providing a steady heating current which changes with the ambient temperature to hold the oven at a precise set-point, usually about 10 degrees above the highest expected ambient temperature.

This invention addresses the continued need for the effective transfer of heat between the heater and the crystal.

SUMMARY OF THE INVENTION

The present invention is directed to an oscillator assembly which comprises at least a circuit board defining opposed top and bottom surfaces, a heater located on one of the opposed top and bottom surfaces of the circuit board, a crystal package located on the other of the opposed top and bottom surfaces of the circuit board, and thermally conductive vias extending through the circuit board for transferring heat from the heater to the crystal package.

The vias define respective openings in the top and bottom surfaces of the circuit board and, in one embodiment, the oscillator further comprises a first conductive pad between the heater and one of the top and bottom surfaces of the circuit board and a second conductive pad between the crystal package and the other of the top and bottom surfaces of the circuit board. The first and second pads overlie and are in thermal coupling relationship with the openings defined by the vias.

The assembly may further comprise a plurality of thermally conductive layers of material extending through the circuit board and in thermal coupling relationship with the vias for transferring heat throughout the board and then to other elements which may be mounted on the board.

Additionally, a layer of thermally conductive epoxy or adhesive material may be used to couple the crystal package to the circuit board.

In one embodiment, the assembly comprises a second circuit board which is suspended over the top surface of the first circuit board. A crystal package is mounted to the bottom surface of the second circuit board. A lid is seated on the first circuit board and covers the second circuit board. A plurality of upstanding supports extending between the first and second boards are used to suspend the second circuit board over the first circuit board.

There are other advantages and features of this invention which will be more readily apparent from the following detailed description of the embodiments of the invention, the drawings, and the appended claims.

BRIEF DESCRIPTION OF THE DRAWINGS

These and other features of the invention can best be understood by the following description of the accompanying drawings as follows.

DETAILED DESCRIPTION AT LEAST ONE EMBODIMENT

Figure 1:
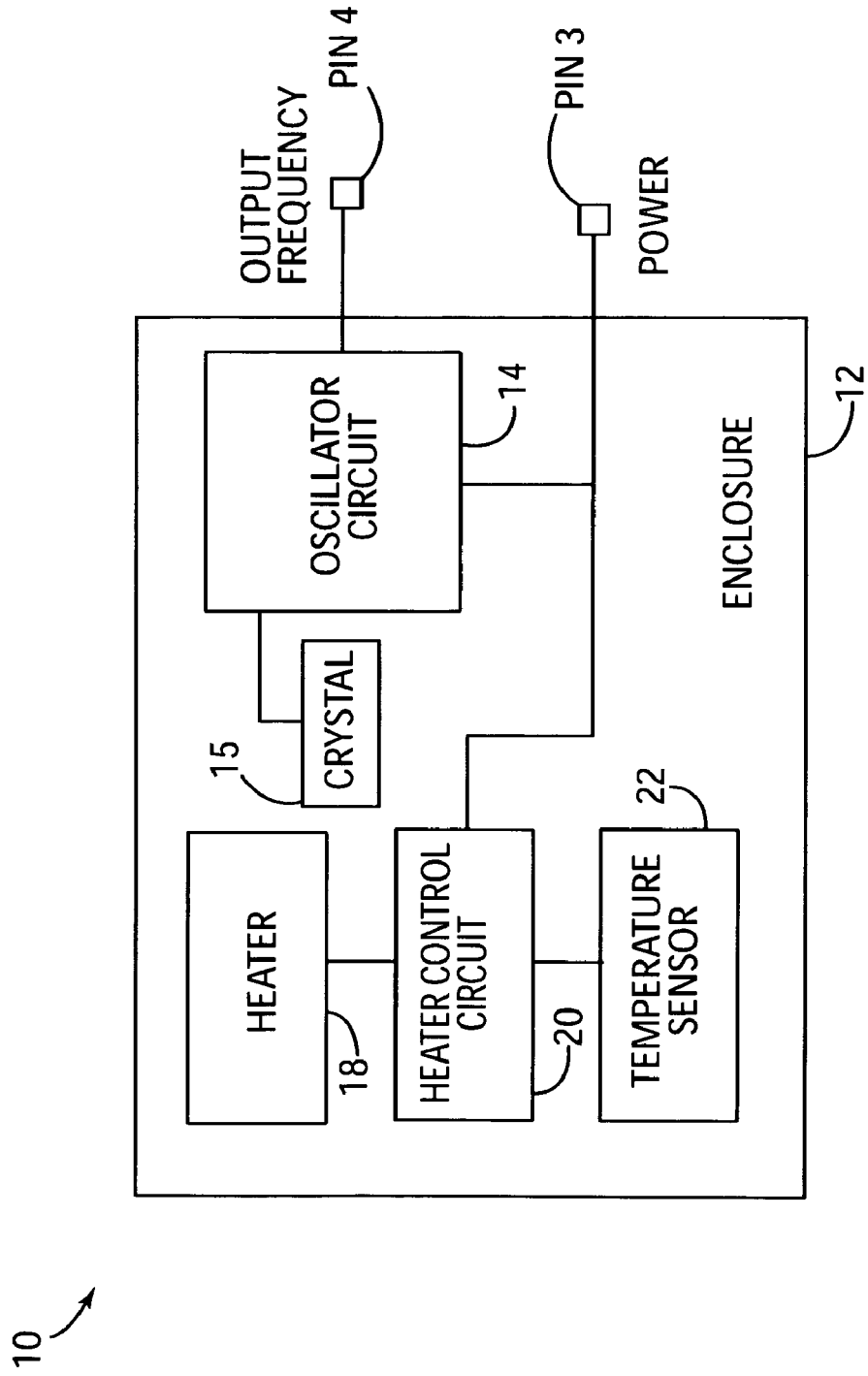
FIG. 1 is substantially a block diagram of an ovenized oscillator in accordance with the present invention.

A diagrammatic view/block diagram of an ovenized oscillator (OCXO) 10 in accordance with the present invention is shown in FIG. 1. Ovenized oscillator 10 includes an enclosure, housing or oven 12 which houses and contains the oscillator components. Oven 12 can be an enclosure with or without insulation. A conventional crystal oscillator circuit 14, which is in communication with a resonator or crystal 15, is located in oven 12. Oscillator circuit 14 can be a Colpitts oscillator circuit using a quartz crystal. Oscillator circuit 14 provides a stable reference frequency at output terminal PIN 4. PIN 3 is a 3.3 volt power supply terminal.

A heater 18 is located in oven 12. Heater 18 is typically a transistor in which the dissipated power is proportionally controlled to heat and maintain a specified temperature level inside the oven 12. A temperature sensor 22 is located in proximity to cover 12. Sensor 22 can be a negative coefficient conventional thermistor adapted to measure the temperature of the crystal. Connected to sensor 22 and heater 18 is a heater control circuit 20 which controls heater 18. Control circuit 20 receives a temperature signal as an input from sensor 22 and provides a heater control signal as an output. When the temperature is below a selected value for the oven, heater control circuit 20 increases the power to heater 18 to increase the temperature in oven 12. When the temperature is above a selected value for the oven, heater control circuit 20 reduces the power to heater 18 to allow a decrease in the temperature in oven 12.

Oscillator Package

A physical embodiment of an ovenized oscillator 10 in accordance with the present invention is shown in FIGS. 2-7. Ovenized oscillator 10 can be packaged in an oscillator assembly, electronic package or oscillator package 800. Oscillator assembly or package 800 may have an overall size of about 25 mm. in length by 22 mm. in width by 8.5 mm. in height and include a generally rectangular-shaped printed circuit board 122 including a top face 123 (FIGS. 2, 4, 5, and 6) on which all of the electrical and electronic components defining the oscillator are appropriately mounted and interconnected together with an enclosure, housing, lid, or cover 12 which covers all of the components. Although not shown, it is understood that, in the embodiment shown, the printed circuit board 122 is made of a plurality of conventional electrically insulative laminates.

Figure 2:
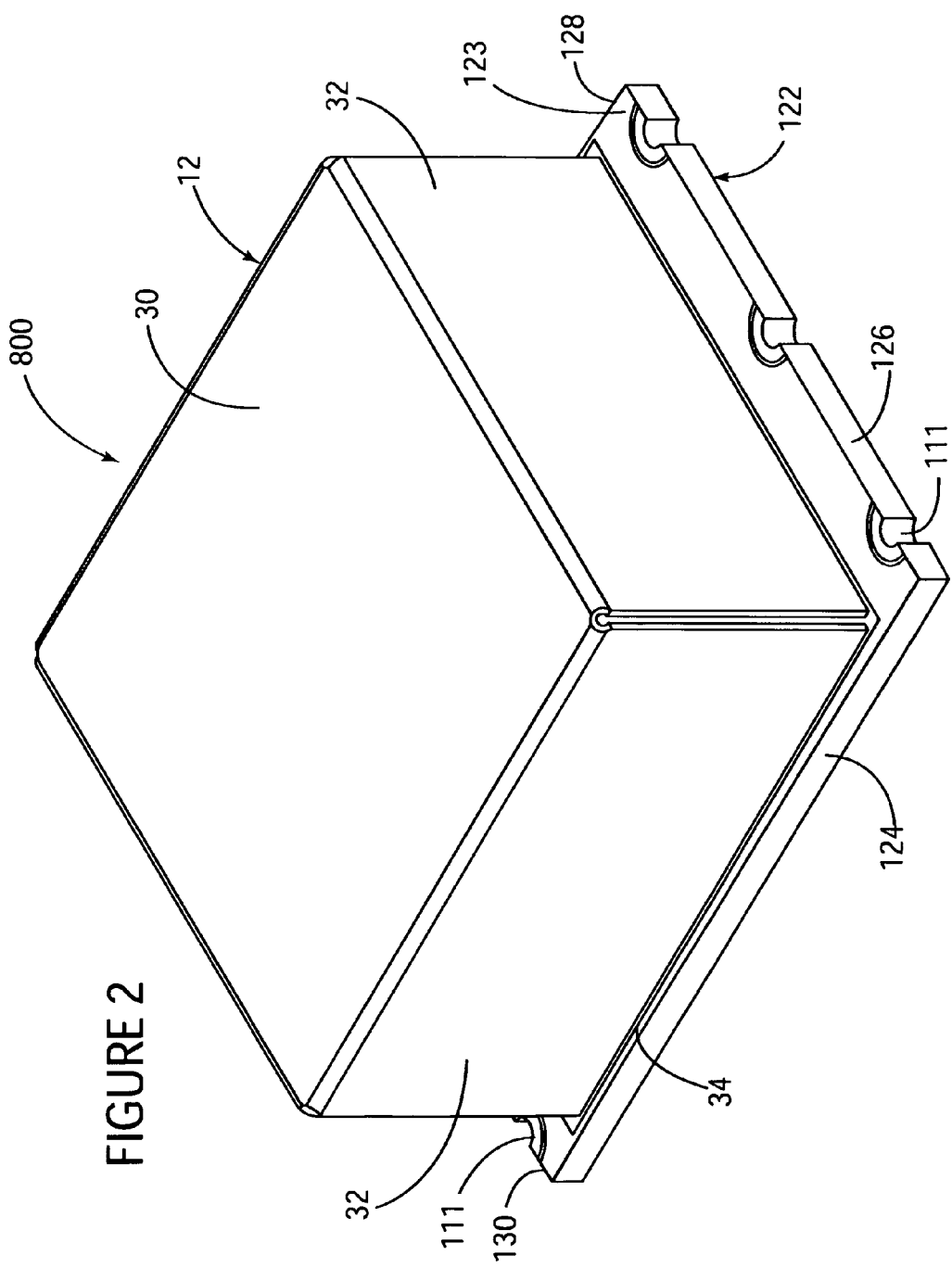
FIG. 2 is a top perspective view of a physical embodiment of an oscillator package incorporating the features of FIG. 1.
Figure 3:
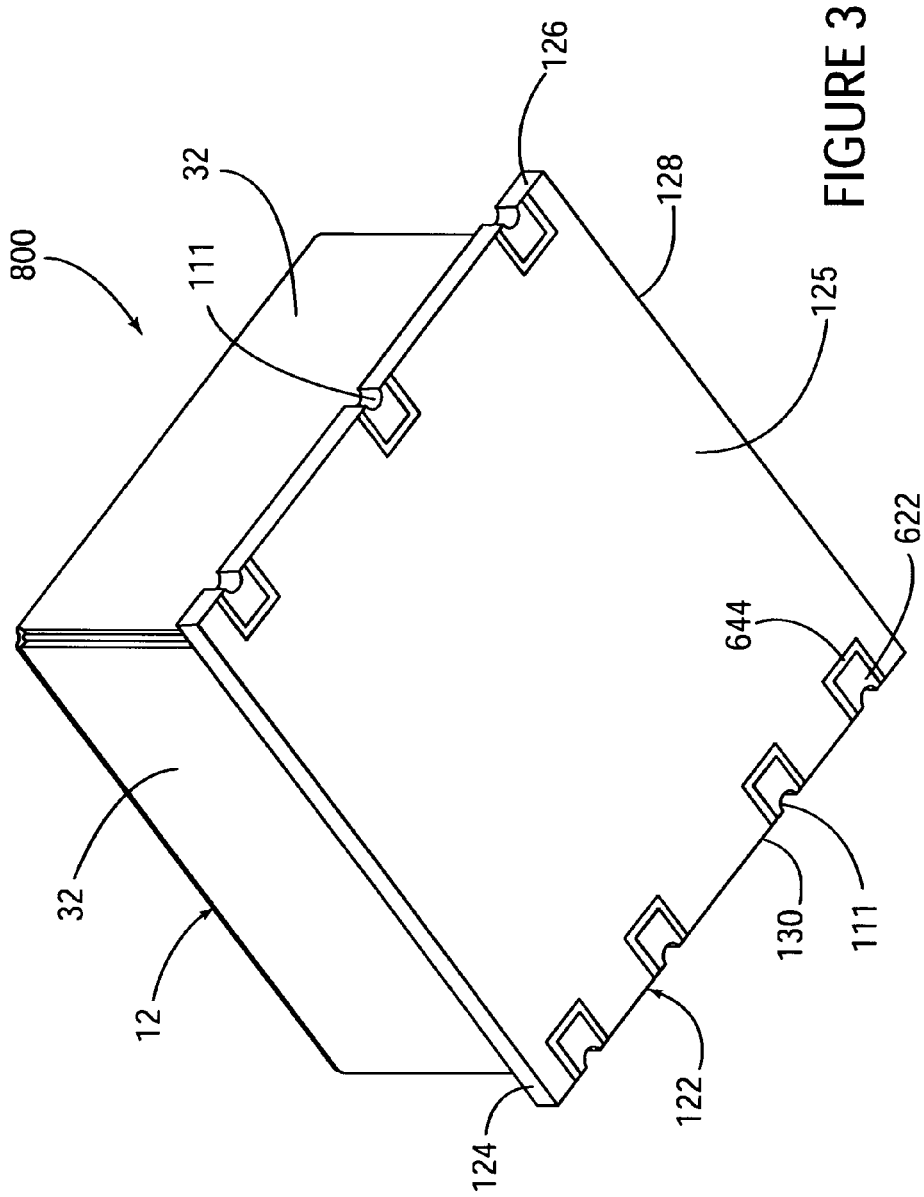
FIG. 3 is a bottom perspective view of the oscillator package of FIG. 2.
Figure 5:
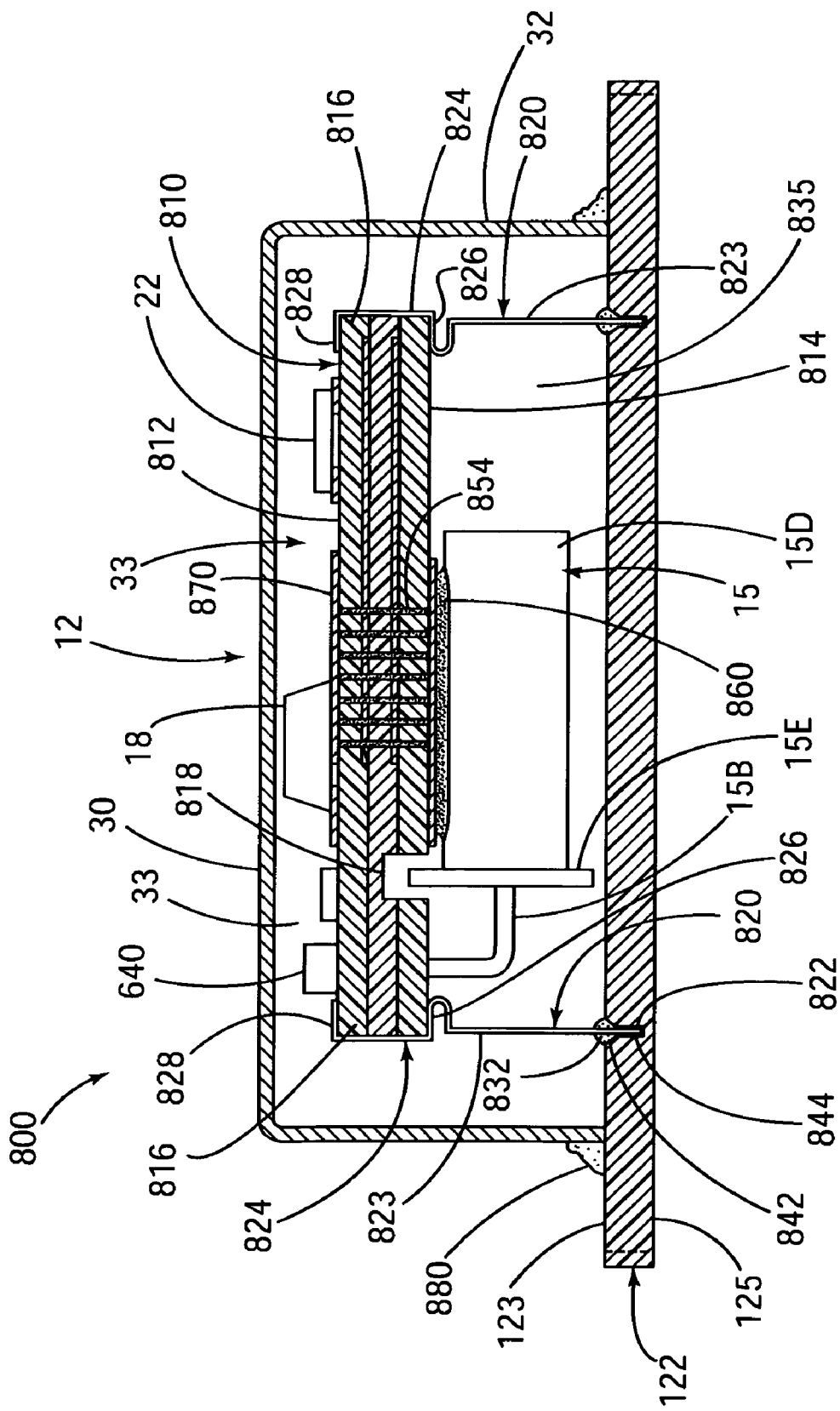
FIG. 5 is a part side elevational view, part vertical cross-sectional view of the interior of the oscillator package of FIG. 4.

Housing 12 defines an interior cavity 33 (FIG. 5) and defines a top roof 30 (FIG. 2) and four downwardly extending side walls 32 (FIGS. 2, 3, and 5). Side walls 32 define respective lower peripheral end face edges 34 (FIG. 2).

Printed circuit board 122 includes respective front and back (top and bottom) faces 123 and 125 and respective elongate side peripheral end edges or faces 124, 126, 128, and 130 (FIGS. 2 and 3).

Referring to FIGS. 2 and 3, a first plurality of castellations 111 defining direct surface mount pads or pins are formed and extend along the length of the board side edge 126 in spaced-apart and parallel relationship.

A second plurality of castellations 111 defining direct surface mount pads are formed and extend along the length of, and generally at opposed ends of, the board side edge 130 in spaced-apart and parallel relationship.

Each of the castellations is defined by a generally semi-circularly-shaped elongate groove which is formed in the respective side edges; extends between the top and bottom faces 123 and 125 of the board 122 in an orientation generally normal thereto; and is covered/coated with a layer of conductive material to define a path for electrical signals between the top and bottom faces 123 and 125 of the board 122.

The castellations are adapted to be seated against the respective pads or pins of a motherboard to which the module 800 is adapted to be direct surface mounted. The castellations are electrically connected with various circuit lines and plated through-holes in circuit board 122.

Each of the grooves defined by the non-ground castellations in the respective top and bottom faces 123 and 125 of board 122 are surrounded by a region/layer 622 of copper conductive material (FIG. 6) which, in turn, is surrounded by a region 644 (FIG. 6) which is devoid of conductive material to separate the respective input and output pins from ground.

FIGS. 4-7 depict the interior of oscillator package or assembly 800 wherein all of the electronic components are mounted on a suspended circuit board 810.

Figure 4:
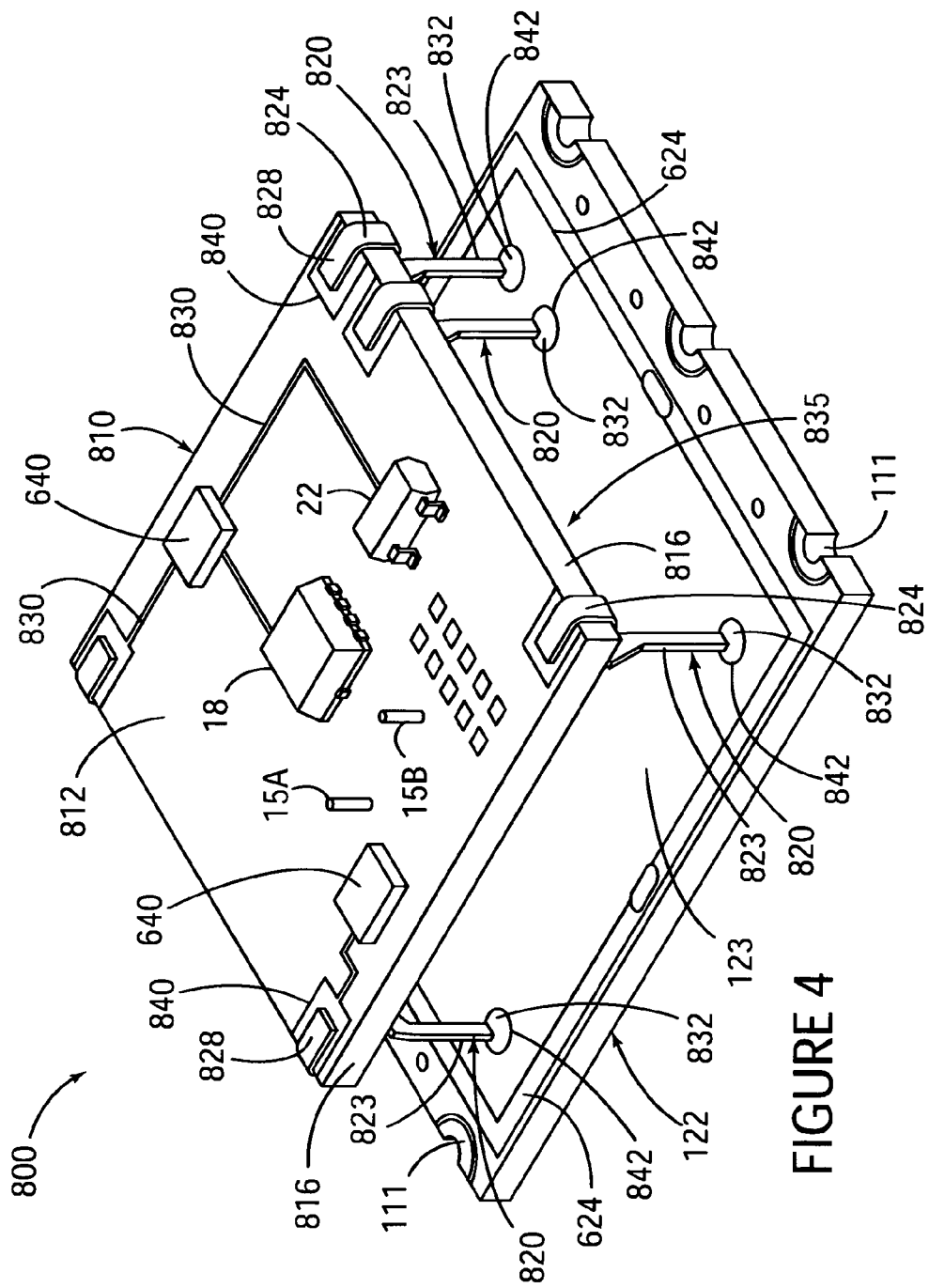
FIG. 4 is a top perspective view of the oscillator package of FIGS. 2 and 3 with the cover removed.
Figure 6:
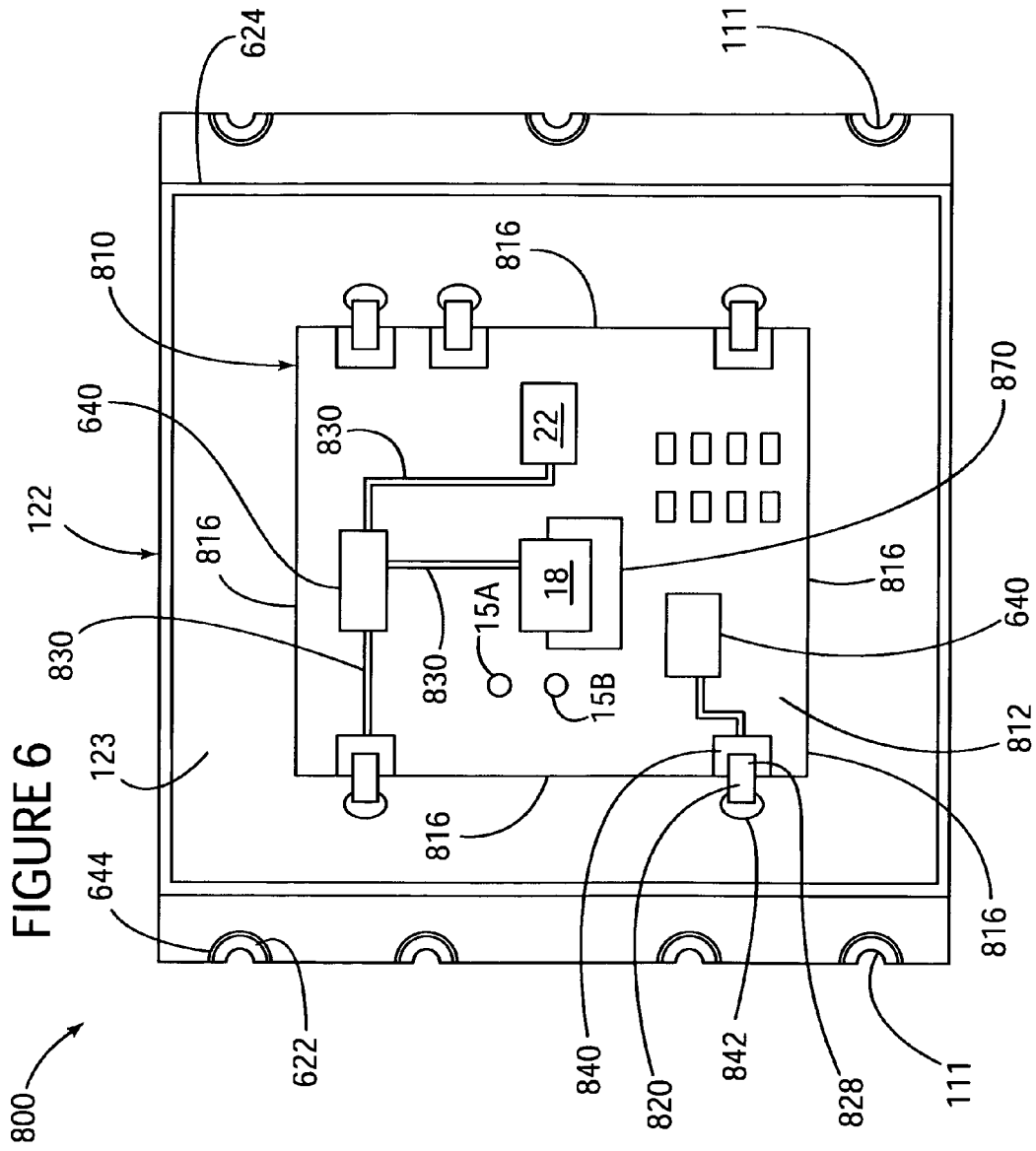
FIG. 6 is a top plan view of the interior of the oscillator package of FIG. 6 without the cover.

Circuit board 810 includes a top surface 812, a bottom surface 814 (FIGS. 4-7), and four outer peripheral end edges or faces 816 (FIGS. 4 and 6). A recess 818 (FIGS. 5 and 7) is defined in the bottom surface 814 of circuit board 810.

Top surface 812 has a pattern of circuit lines 830 and connection pads 840 (FIGS. 4 and 6). Circuit lines 830 and connection pads 840 may be formed of copper. Circuit lines 830 and connection pads 840 are adapted to interconnect the various electronic components 640, the heater 18, and the temperature sensor 22 that are all direct surface mounted to the top surface 812 of board 810.

A plurality of conductive supports or posts 820 (FIGS. 4, 5, and 6) extend between circuit board 122 and circuit board 810 in an orientation generally perpendicular to the boards 122 and 810 to define upstanding supports which allow for the suspension of board 810 above the board 122 in a spaced-apart and parallel relationship. Conductive supports 820 may be formed from a conductive metal or the like material. Conductive supports 820 provide an electrical connection for signals between circuit board 122 and circuit board 810. Each of the conductive supports or posts 820 has an upstanding, generally vertical, leg portion 823 and a generally horizontally oriented clip portion 824. Leg portion 823 defines a first proximal end 822 (FIG. 5) which is secured in respective bores 844 (FIG. 5) defined in the top surface of the board 122 and holds the respective supports 820 upright and vertical relative to the board 122. Clip portion 824 is defined by a portion of posts 820 which has been bent to define a board edge receiving clip.

Clip portion 824 is defined by a pair of spaced-apart, generally parallel, prongs 826 and 828 protruding generally horizontally inwardly from a top distal end portion of the support leg 820 (FIGS. 4, 5, and 6). Clip portion 824 is adapted to mount over the outer edge 816 of board 810 such that the outer edge 816 of board 810 extends between prongs 826 and 828 which grasp outer edge 816 and define fingers in abutting relationship with the top and bottom surfaces of the board 810 respectively. Prong or finger 828 is adapted to make an electrical connection with connection pad 840 on board 810 (FIGS. 4, 5, and 6). Prong or finger 828 may also be soldered to connection pad 840.

Top surface 123 of circuit board 122 also defines a bore 844 and a counter-bore 842 (FIG. 5). Bore 844 and counter-bore 842 are plated with copper. End 822 of the leg 823 of respective supports 820 can be mounted in bore 844 and retained by solder joint 832. Oscillator package 800 can include four supports or posts 820 located respectively at the respective corners of the board 810. A fifth support 820 is located adjacent and parallel to one of the other supports 820. Alternatively, leg 823 may be press fit into bore 844.

Crystal package 15 is attached to the bottom surface 814 of circuit board 810 and, more specifically, in the space or gap 835 (FIG. 4) defined by the supports 820 between the boards 122 and 810. A layer of thermal adhesive or epoxy material 860 (FIGS. 5 and 7) bonds crystal body 15D to the bottom surface 814 of board 810 and the top of lid 15E thereof extends in a direction generally normal to the boards 122 and 810 and protrudes into the recess 818 defined in the lower surface 814 of board 810. Electrical lead 15B connects between crystal body 15D and a connection pad (not shown) on bottom surface 814. Crystal body 15D may contain an SC or AT cut quartz crystal.

The use of a circuit board 810 and crystal package 15 suspended above, and spaced from, circuit board 122 by conductive supports 820 allows the crystal package 15 to be thermally isolated on all sides from the ambient environment outside of housing 12 and circuit board 122. The thermal isolation of crystal package 15 provides a more stable output frequency of the oscillator.

Housing, lid, or cover 12, which is similar to lid 12 of package 600, defines an oven, is fitted over the top face 123 of the board 122, surrounds the board 810, and covers all of the components mounted on the board 810. Cover 12 has side walls 32 whose lower peripheral end faces can be secured to the top surface of the board 122 using a solder joint 880 (FIG. 5). Lid 12 is adapted to be seated on region 624 of board 122 shown in FIG. 6.

In another embodiment, lid 12 may be formed from a plastic material and mounted to circuit board 122 using an adhesive.

Further details of the construction of multi-layer circuit board 810 will now be described with specific reference to FIG. 7.

Figure 7:
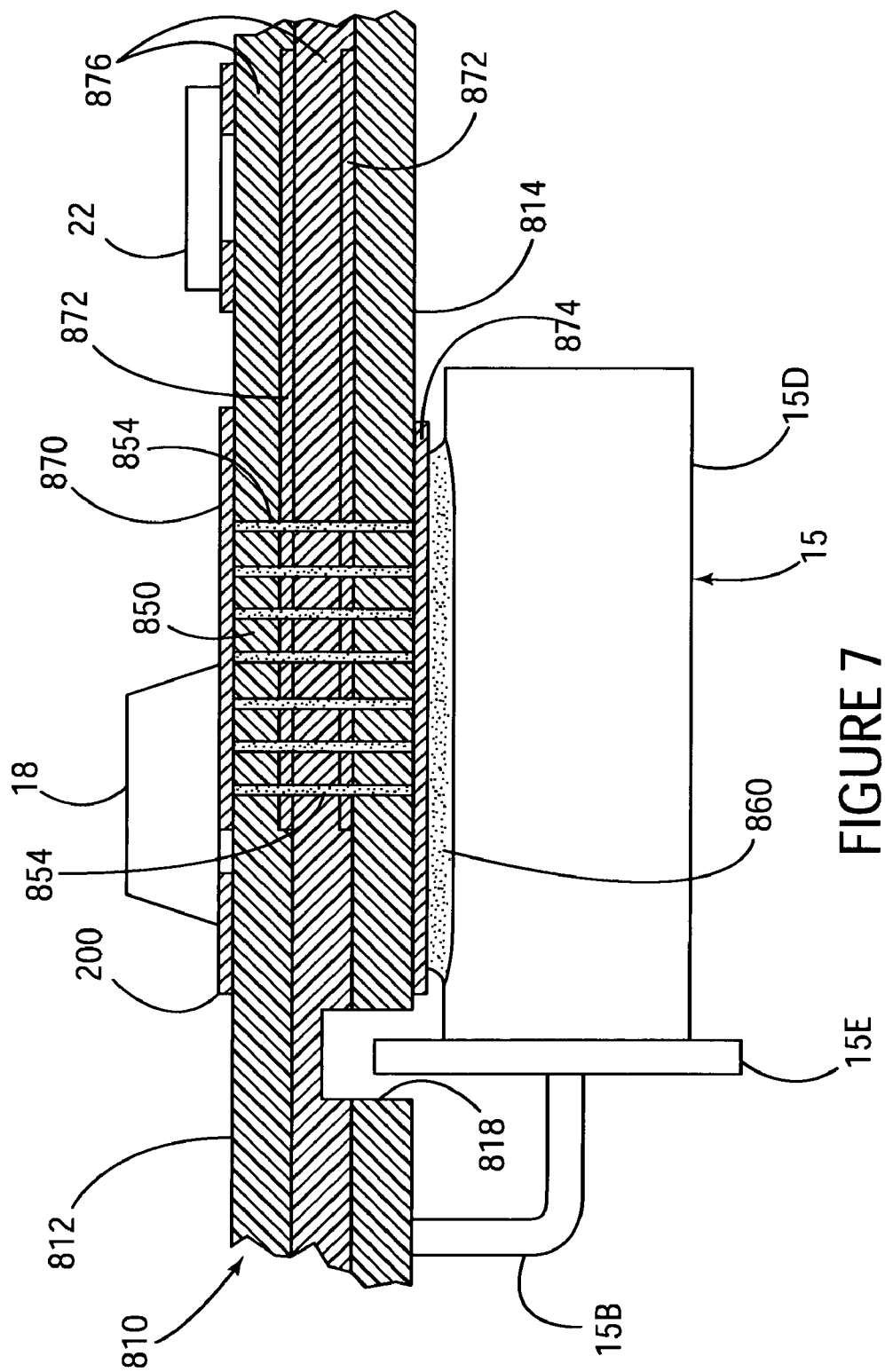
FIG. 7 is an enlarged part side elevational view, part vertical cross-sectional view of a portion of the oscillator package of FIG. 6 depicting the vias extending through the circuit board in the region below the heater and above the crystal.

As shown in FIG. 7, power transistor/heater 18 is mounted and located on the top surface of board 810 in a relationship generally opposed to the crystal package located and mounted to the bottom surface of the board 810. In as much as there is a desire and need to evenly space the heat generated by the transistor 18 to the crystal package 15 and minimize heat spots, the board 810 includes a center region 850 that has vias 854 which can be made of any suitable thermally conductive material including plated copper, double-plated copper, copper filled, or plated copper vias filled with solder that extend generally vertically through circuit board 810 between top surface 812 and bottom surface 814.

Center region 850 further includes a conductive pad 870 which may be made of copper or the like material and is mounted on the top surface 812 of board 810 to which the drain of heater transistor 18 is soldered. The transistor 18 is preferably seated on top of the pad 870 and the vias 854 preferably extend at least in the region of the board 810 located below pad 870 and above the crystal 15. The vias 854, which extend between the top and bottom surfaces of the board 810 in a spaced-apart and generally parallel relationship, create a heat-spreading network or grid.

The heat-spreading network or grid is further defined by a plurality of spaced-apart, generally parallel layers 872 of thermally conductive material such as, for example, copper which extend generally longitudinally and horizontally through the body of the board 70 in a relationship generally normal to and intersecting with the vias 854. Layers 872 preferably have a length sufficient to allow the same to be located beneath both the heater 22 and any other elements on the board 810 to which the transfer of heat may be desirable such as, for example, element 22.

Conductive pad 870 overlies the openings defined in the top surface of board 810 by vias 854 and is thus thereby thermally coupled and connected to vias 854. Heat from heater transistor 18 to crystal package 15 is spread and conducted initially generally horizontally through conductive pad 870 and then generally vertically downwardly through each of the vias 854 and then spaced and spread generally horizontally through a conductive pad 874 which overlies openings defined in the bottom surface of board 810 by the vias 854, then to adhesive pad 860, and finally to the top surface of crystal body 15D. The combination of the conductive pads 870 and 872 and the vias 854 allows for heat generated by heater 18 to be uniformly distributed and spread across the full length of the crystal body 15D.

Recess 818 accepts lid 15E and allows crystal body 15D to lay flat on and maintain better contact between the thermal adhesive layer 860 and the bottom surface 814 of board 810.

Additionally, it is understood that vias 854 are also thermally coupled to the board layers 872 of thermally conductive copper or the like material, thus also allowing heat to be spread and conducted generally horizontally through the board 810 and then generally vertically upwardly through the other layers 876 of the board 810 into, for example, the element 22 seated on the top surface 812 of the board 810.

CONCLUSION

While the invention has been taught with specific reference to this embodiment, someone skilled in the art will recognize that changes can be made in form and detail without departing from the spirit and the scope of the invention. The described embodiment is to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An oscillator assembly comprising at least:
a circuit board defining opposed surfaces;
a heater located on one of the opposed surfaces of the circuit board;
a crystal package located on the other of the opposed surfaces of the circuit board; and
a plurality of vias plated or filled with a thermally conductive material and extending between the opposed surfaces of the circuit board for transferring heat from the heater to the crystal package, the plurality of vias defining respective openings in the opposed surfaces of the circuit board, the oscillator further comprising a first conductive pad between the heater and one of the opposed surfaces of the circuit board and a second conductive pad between the crystal package and the other of the opposed surfaces of the circuit board, the first and second pads overlying and in thermal coupling relationship with the openings defined by the vias.

2. The oscillator assembly of claim 1 further comprising at least one layer of thermally conductive material extending through the body of the circuit board and in thermal coupling relationship with the plurality of vias for transferring heat throughout the board.

3. The oscillator assembly of claim 1, wherein a layer of thermally conductive material couples the crystal package to the circuit board.

4. An oscillator assembly comprising at least:
a circuit board defining opposed surfaces;
a heater mounted on one of the opposed surfaces of the circuit board; and
a crystal package coupled to the other of the opposed surfaces of the circuit board;
wherein the circuit board defines a plurality of vias plated or filled with a thermally conductive material and extending between the opposed surfaces of the circuit board and a plurality of layers of thermally conductive material extend through the body of the circuit board and in thermal coupling relationship with the plurality of vias, the vias being adapted to transfer heat from the heater to the crystal package and to the plurality of layers of thermally conductive material for spreading heat throughout the body of the circuit board, the plurality of vias defining respective openings in the opposed surfaces of the circuit board and the heater overlies and is in thermally coupling relationship with the openings defined in one of the opposed surfaces of the circuit board, the oscillator further comprising a conductive pad between the circuit board and the heater, the conductive pad overlying the openings defined by the plurality of vias.

5. The oscillator assembly of claim 4, wherein the plurality of vias and the plurality of layers of thermally conductive material intersect in the body of the circuit board and form a grid.

6. The oscillator assembly of claim 4, further comprising:
a conductive pad between the circuit board and the crystal package, the conductive pad overlying the openings of the plurality of vias defined in the other of the opposed surfaces of the circuit board; and
a layer of thermally conductive material between the conductive pad and the crystal package.

* * * * *